(12) United States Patent
Zhang et al.

(10) Patent No.: US 8,977,937 B2
(45) Date of Patent: Mar. 10, 2015

(54) SYSTEMS AND METHODS FOR COMPRESSION DRIVEN VARIABLE RATE DECODING IN A DATA PROCESSING SYSTEM

(75) Inventors: Fan Zhang, Milpitas, CA (US);
Shaohua Yang, San Jose, CA (US);
Yang Han, Sunnyvale, CA (US);
Chung-Li Wang, San Jose, CA (US);
Weijun Tan, Longmont, CO (US)

(73) Assignee: LSI Corporation, San Jose, CA (US)

( * ) Notice: Subject to any disclaimer, the term of this patent is extended or adjusted under 35 U.S.C. 154(b) by 190 days.

(21) Appl. No.: 13/422,986

(22) Filed: Mar. 16, 2012

(65) Prior Publication Data

US 2013/0246877 A1  Sep. 19, 2013

(51) Int. Cl.
*H03M 13/00* (2006.01)

(52) U.S. Cl.
USPC ............ 714/779; 714/752; 714/800; 714/819

(58) Field of Classification Search
CPC ..... H04L 1/0057; H04L 1/0054; H04L 1/005; H03M 13/09; H03M 13/6516; H03M 13/116; H03M 13/255; H03M 13/6393; G11B 20/1833
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku et al. |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |

(Continued)

OTHER PUBLICATIONS

Casado et al., Multiple-rate low- density parity-check codes with constant blocklength, IEEE Transations on communications, Jan. 2009, vol. 57, pp. 75-83.

(Continued)

*Primary Examiner* — Albert Decady
*Assistant Examiner* — Enamul M Kabir
(74) *Attorney, Agent, or Firm* — Hamilton DeSanctis & Cha

(57) ABSTRACT

The present inventions are related to systems and methods for data processing, and more particularly to systems and methods for variable rate encoding and/or decoding in a data processing system. In some cases, embodiments include a variable length data decoder circuit that is operable to apply a decode algorithm to the encoded input based upon a first selected H-Matrix to yield a first decoded output and apply the decode algorithm to the encoded input based upon a second selected H-Matrix to yield a second decoded output.

20 Claims, 7 Drawing Sheets

(56) References Cited

U.S. PATENT DOCUMENTS

| | | | |
|---|---|---|---|
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,604,222 B1* | 8/2003 | Jensen | 714/785 |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,559,008 B1* | 7/2009 | Patapoutian | 714/800 |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Vila Casado et al. | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,255,765 B1* | 8/2012 | Yeo et al. | 714/758 |
| 8,261,171 B2 | 9/2012 | Annampedu | |
| 8,291,284 B2 | 10/2012 | Savin | |
| 8,295,001 B2 | 10/2012 | Liu | |
| 8,516,339 B1* | 8/2013 | Lesea et al. | 714/763 |
| 2004/0034828 A1* | 2/2004 | Hocevar | 714/800 |
| 2004/0194007 A1* | 9/2004 | Hocevar | 714/801 |
| 2005/0243456 A1* | 11/2005 | Mitchell et al. | 360/46 |
| 2006/0031744 A1* | 2/2006 | Blankenship et al. | 714/801 |
| 2006/0271616 A1* | 11/2006 | Yoshida | 708/531 |
| 2008/0037676 A1* | 2/2008 | Kyung et al. | 375/265 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2010/0042894 A1* | 2/2010 | Gunnam | 714/752 |
| 2010/0042895 A1* | 2/2010 | Gunnam | 714/752 |
| 2010/0042896 A1* | 2/2010 | Gunnam | 714/752 |
| 2010/0275088 A1* | 10/2010 | Graef | 714/752 |
| 2010/0322048 A1* | 12/2010 | Yang et al. | 369/47.15 |
| 2010/0325511 A1* | 12/2010 | Oh et al. | 714/752 |
| 2011/0167227 A1 | 7/2011 | Yang | |
| 2011/0264987 A1 | 10/2011 | Li | |
| 2011/0307760 A1* | 12/2011 | Pisek et al. | 714/763 |
| 2011/0320902 A1* | 12/2011 | Gunnam | 714/752 |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricie" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2Am) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/284,730, filed Oct. 28, 2011, Fan Zhang, Unpublished.

U.S. Appl. No. 13/295,150, filed Nov. 14, 2011, Zongwang Li, Unpublished.

U.S. Appl. No. 13/284,767, filed Oct. 28, 2011, Fan Zhang, Unpublished.

U.S. Appl. No. 13/269,832, filed Oct. 10, 2011, Haitao Xia, Unpublished.

U.S. Appl. No. 13/227,544, filed Sep. 8, 2011, Shaohua Yang, Unpublished.

U.S. Appl. No. 13/239,683, filed Sep. 22, 2011, Changyou Xu, Unpublished.

U.S. Appl. No. 13/186,234, filed Jul. 19, 2011, Haitao Xia, Unpublished.

(56) References Cited

OTHER PUBLICATIONS

U.S. Appl. No. 13/213,751, filed Aug. 19, 2011, Fan Zhang, Unpublished.
U.S. Appl. No. 13/415,430, filed Mar. 8, 2012, Nayak Ratnakar Aravind, Unpublished.
U.S. Appl. No. 13/180,495, filed Jul. 11, 2011, Chung-Li Wang, Unpublished.
U.S. Appl. No. 13/340,951, filed Dec. 30, 2011, Lei Chen, Unpublished.
U.S. Appl. No. 13/300,078, filed Nov. 18, 2011, Chung-Li Wang, Unpublished.
U.S. Appl. No. 13/302,119, filed Nov. 22, 2011, Lei Chen, Unpublished.
U.S. Appl. No. 13/305,510, filed Nov. 28, 2011, Lei Chen, Unpublished.
U.S. Appl. No. 13/227,416, filed Sep. 7, 2011, Lei Chen, Unpublished.
U.S. Appl. No. 13/305,551, filed Nov. 28, 2011, Yang Han, Unpublished.
U.S. Appl. No. 13/296,022, filed Nov. 14, 2011, Victor Krachkovsky, Unpublished.
U.S. Appl. No. 13/174,537, filed Jun. 30, 2011, Anantha Raman Krishnan, Unpublished.
U.S. Appl. No. 13/174,453, filed Jun. 30, 2011, Johnson Yen, Unpublished.
U.S. Appl. No. 13/283,549, filed Oct. 27, 2011, Wu Chang, Unpublished.
U.S. Appl. No. 13/171,615, filed Jun. 29, 2011, Bradley D. Seago, Unpublished.
U.S. Appl. No. 13/269,852, filed Oct. 10, 2011, Haitao Xia, Unpublished.
U.S. Appl. No. 13/113,219, filed May 23, 2011, Yang Han, Unpublished.
U.S. Appl. No. 13/369,468, filed Feb. 9, 2012, Zongwang Li, Unpublished.
U.S. Appl. No. 13/372,580, filed Feb. 14, 2012, Fan Zhang, Unpublished.
U.S. Appl. No. 13/412,520, filed Mar. 5, 2012, Fan Zhang, Unpublished.
U.S. Appl. No. 13/362,409, filed Jan. 31, 2012, Fan Zhang, Unpublished.
U.S. Appl. No. 13/316,858, filed Dec. 12, 2011, Zongwang Li, Unpublished.
U.S. Appl. No. 13/316,741, filed Dec. 12, 2011, Yang Han, Unpublished.
U.S. Appl. No. 13/327,279, filed Dec. 15, 2011, Wei Feng, Unpublished.
U.S. Appl. No. 13/340,974, filed Dec. 30, 2011, Dan Liu, Unpublished.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 08/99.
Yeo et al., "VLSI Architecture for Iterative Decoders in Magnetic Storage Channels", Mar. 2001, pp. 748-55, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Quasi Cyclic LDPC Codes for the Magnetic Recording Channel: Code Design and VSLI Implementation", IEEE Transactions on Magnetics, v. 43, pp. 1118-11123, Mar. 2007.
Zhong et al., "Joint Code-Encoder Design for LDPC Coding System VLSI Implementation", ISCAS, IEEE pp. 389-392, May 2004.
Zhong et al., "High-Rate Quasi-Cyclic LDPC Codes for Magnetic Recording Channel with Low Error Floor", ISCAS, IEEE pp. 3546-3549, May 2006.
Zhong et al., "Design of VLSI Implementation-Oriented LDPC Codes", IEEE, pp. 670-673, 2003.
Zhong, "Block-LDPC: A Practical LDPC Coding System Design Approach", IEEE Trans. On Circuits, Regular Papers, vol. 5, No. 4, pp. 766-775, Apr. 2005.
Xiao, et at "Nested Codes With Multiple Interpretations" retrieved from the Internet URL: http://www.ece.nmsu.edu (published 2006) (retrieved on Dec. 5, 2012).

\* cited by examiner

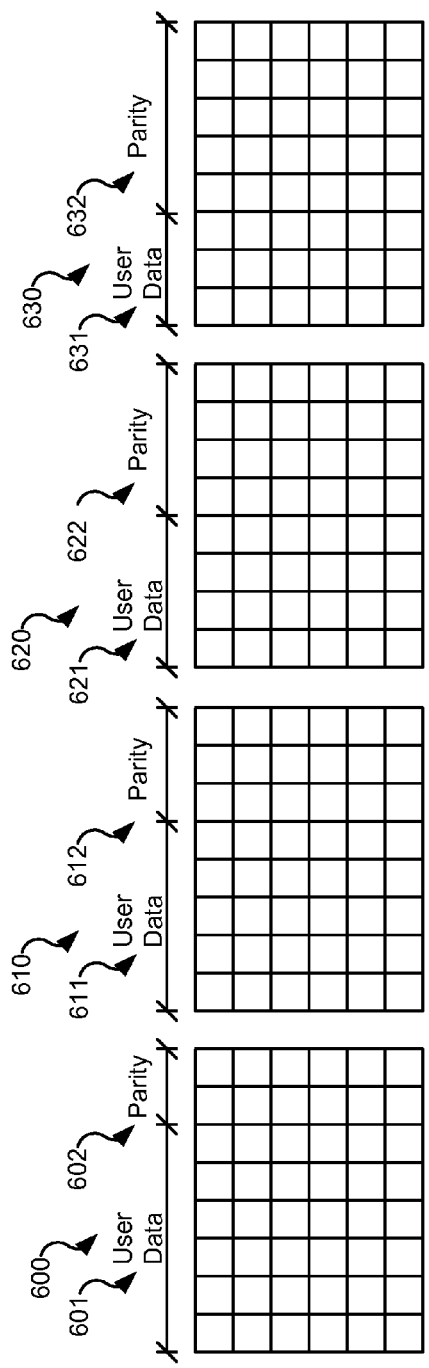
Fig. 6a
Fig. 6b
Fig. 6c
Fig. 6d
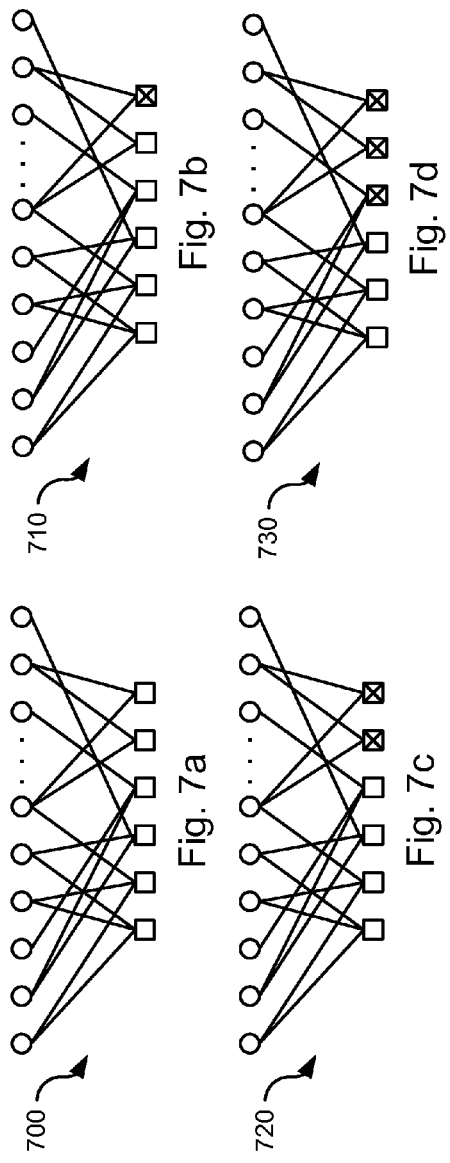
Fig. 7a
Fig. 7b
Fig. 7c
Fig. 7d

SYSTEMS AND METHODS FOR COMPRESSION DRIVEN VARIABLE RATE DECODING IN A DATA PROCESSING SYSTEM

BACKGROUND OF THE INVENTION

The present inventions are related to systems and methods for data processing, and more particularly to systems and methods for variable rate encoding and/or decoding in a data processing system.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function receives data sets and applies a data decode algorithm to the data sets to recover an originally written data set. In some cases, the originally written data sets can be compressed, thereby reducing the size of the data set to be transferred. In a typical system, such a reduction would be offset by a padding process designed to render a transfer data set of a common size. Such an approach results in a waste of bandwidth.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for variable rate encoding and/or decoding in a data processing system.

Various embodiments of the present invention provide data processing systems that include a variable length data decoder circuit. The variable length data decoder circuit is operable to: receive an encoded input; select a first H-Matrix to yield a first selected H-Matrix; apply a decode algorithm to the encoded input based upon the first selected H-Matrix to yield a first decoded output; select a second H-matrix to yield a second selected H-Matrix; apply the decode algorithm to the encoded input based upon the second selected H-Matrix to yield a second decoded output; and provide the first decoded output as a data output where the first decoded output converged and the second decoded output failed to converge. In some cases, selection of the first H-Matrix and application of the decode algorithm based on the first H-matrix precedes selection of the second H-Matrix and application of the decode algorithm based on the second H-Matrix. In other cases, selection of the second H-Matrix and application of the decode algorithm based on the second H-matrix precedes selection of the first H-Matrix and application of the decode algorithm based on the first H-Matrix. In various instances of the aforementioned embodiments, the system is implemented as an integrated circuit. In some cases the system is incorporated in, for example, a storage device, or a data transmission device.

In some instances of the aforementioned embodiments, the data processing system further includes a data detector circuit operable to apply a data detection algorithm to a data input to yield a detected output. In such instances, the encoded input is derived from the detected output. In some cases, the variable length decoder circuit is a variable length low density parity check decoder circuit.

In various instances of the aforementioned embodiments, the first H-Matrix and the second H-Matrix are incorporated in a nested H-Matrix. In some such instances, the first H-Matrix is operable to decode a codeword including a first number of parity bits per number of data bits, and the second H-Matrix is operable to decode a codeword including a second number of parity bits per number of data bits. In particular cases, the variable length data decoder circuit is operable to disable one or more parity check equations based upon which of the first H-Matrix and the second H-Matrix is selected.

In one or more instances of the aforementioned embodiments, the data processing system further includes: a data compression circuit, a first encoder circuit, and a second encoder circuit. The data compression circuit is operable to compress a received input to yield a compressed output. The first encoder circuit is operable to modify the compressed output to yield a modified output. The second encoder circuit operable to: determine a length of the modified output; select a G-Matrix from at least a first G-Matrix and a second G-Matrix to yield a selected G-Matrix based at least in part on the length of the modified output; and encode the modified output based upon the selected G-Matrix to yield a codeword. In such instances, selection of the first G-Matrix causes the second encoder to yield a first number of parity bits for the modified output, and selection of the second G-Matrix causes the second encoder to yield a second number of parity bits for the modified output. In some cases, the first G-Matrix yields a codeword compatible with the first H-Matrix, and the second G-Matrix yields a codeword compatible with the second H-Matrix. In various cases where a defined length of the codeword less the first number of parity bits and the length of the modified output is a first size and the defined length of the codeword less the second number of parity bits and the length of the modified output is a second size, and the selected G-Matrix is the first G-Matrix when the first size is less than the second size.

Other embodiments of the present invention provide methods for data processing that include: receiving an encoded input; selecting a first H-Matrix to yield a first selected H-Matrix; applying a decode algorithm to the encoded input based upon the first selected H-Matrix to yield a first decoded output; selecting a second H-matrix to yield a second selected H-Matrix; applying the decode algorithm to the encoded input based upon the second selected H-Matrix to yield a second decoded output; and providing the first decoded output as a data output where the first decoded output converged and the second decoded output failed to converge. In some cases, selecting the second H-Matrix and applying the decode algorithm to the encoded input based upon the second selected H-Matrix precedes selecting the first H-Matrix and applying the decode algorithm to the encoded input based upon the first selected H-Matrix.

In some instances of the aforementioned embodiments, the methods further include: compressing a received input to yield a compressed output; applying a first level encoding to the compressed output to yield a modified output; selecting a G-Matrix from at least a first G-Matrix and a second G-Matrix to yield a selected G-Matrix; determining a length of the modified output; and selecting a G-Matrix from at least a first G-Matrix and a second G-Matrix to yield a selected G-Matrix. The first G-Matrix yields a codeword compatible with the first H-Matrix, and the second G-Matrix yields a codeword compatible with the second H-Matrix. Such methods further include applying a second level encoding to the modified output to yield a codeword. Selection of the first G-Matrix causes the second level encoding to yield a first number of parity bits for the modified output, and selection of the second G-Matrix causes the second level encoding to yield a second number of parity bits for the modified output. The encoded input is derived from the codeword.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 3b-3c show example variably encoded codewords that may be generated using the data encoding circuit of FIG. 3a;

FIGS. 6a-6d show example nested H-matrices that may be used in relation to various embodiments of the present invention; and FIGS. 7a-7d graphically show a variable length decoder circuit relying on nested H-matrices in accordance with some embodiments of the present invention.

DETAILED DESCRIPTION OF THE INVENTION

The present inventions are related to systems and methods for data processing, and more particularly to systems and methods for variable rate encoding and/or decoding in a data processing system.

Various embodiments of the present invention provide for data processing that includes compressing received information to yield a compressed output, modulating the compressed output, and then applying a variable length data encoding to yield a codeword of a defined length. The variable length encoding relies on a nested G-matrix including a finite number of incorporated G-matrices. One of the incorporated G-matrices is selected to perform the encoding based upon its ability to insert an amount of parity check data that will make a desired utilization of the fixed length of the codeword.

The codeword is then decoded using a variable length decoding circuit that relies on nested H-matrices that correspond to the nested G-matrices used in the encoding process. Two or more of the nested H-matrices are used in a row to determine which of the nested H-matrices is appropriate for decoding. Decoding succeeds where use of a first H-matrix results in convergence followed by use of a second H-matrix that does not result in convergence. Alternatively, decoding may be considered successful where use of a first H-matrix does not result in convergence followed by use of a second H-matrix that does result in convergence. Where one of the aforementioned conditions is not met, the decoding is not considered a success. The result of the decoding is demodulated and decompressed to reverse the processes originally applied in the encoding process to yield the originally written data set. Such an approach allows for variable decoding without passing bits or data indicating the level of variable encoding applied to the data set being processed in the data decoder.

Figure 1:
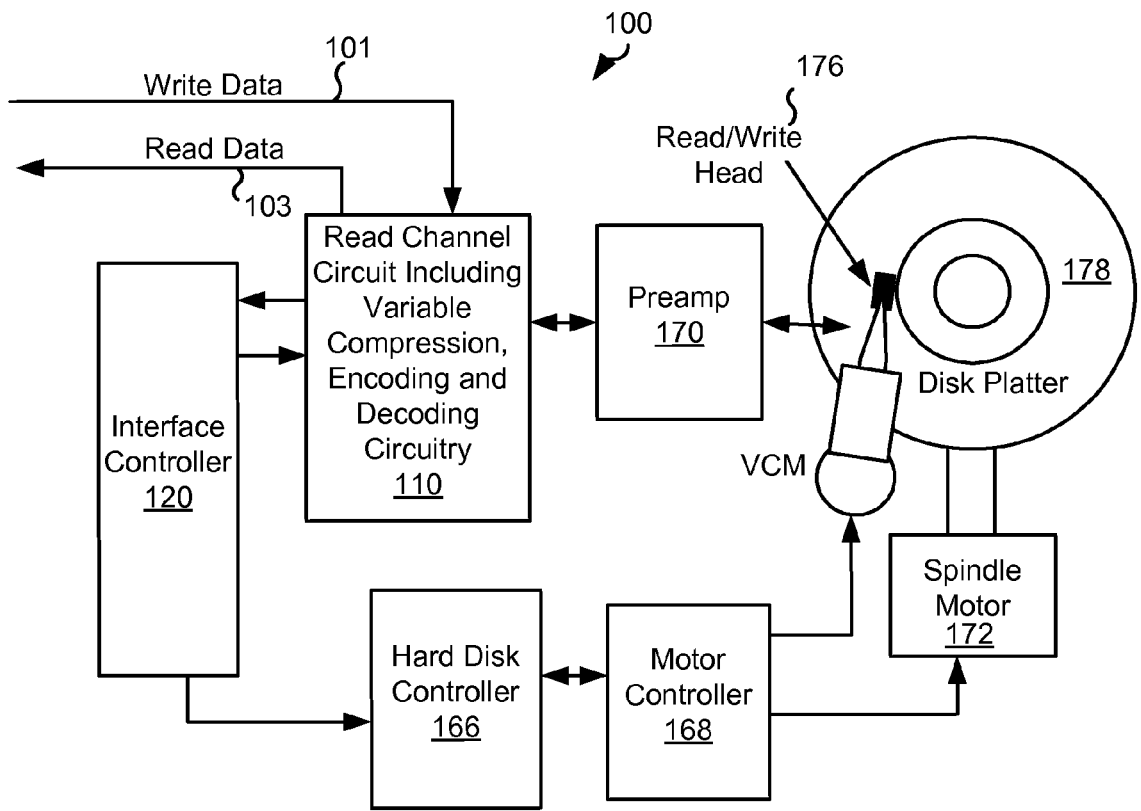
FIG. 1 shows a storage system including variable compression, encoding and decoding circuitry in accordance with various embodiments of the present invention.

Turning to FIG. 1, a storage system 100 including a read channel circuit 110 having variable compression, encoding and decoding circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to host controller 190. A write operation is different in that host controller 190 provides write data 190 to read channel circuit 110 that proceeds to encode and write the data to disk platter 178 using hard disk controller 166, motor controller 168, read/write head assembly 176, and spindle motor 172 to effectuate the write to the desired location.

As part of processing received write data 101 during a write, data is compressed, modulated and encoded. The encoding is done using an encoder relying on a nested G-matrix to perform the decoding, with a particular G-matrix of the nested G-matrix selected to improve the utilization of a defined length of an output codeword. The resulting output codeword is written to disk platter 178 via read/write head assembly 176. As part of processing received information during a read, data is decoded by a variable length decoder circuit relying on a nested H-matrix that corresponds to the nested G-matrix used to perform the encoding. The appropriate H-matrix is selected by selecting a given H-matrix and performing a decode until one of the H-matrices incorporated in the nested H-matrix succeeds. The result of the decoding is demodulated and decompressed to reverse the processes originally applied in the encoding process to yield the originally written data set which is provided as read data 103. In some cases, read channel circuit 110 may be implemented to include a data encoding/decoding circuitry similar to that discussed below in relation to FIG. 3a and FIG. 4. Further, the data processing may be done consistent with an approach discussed below in relation to FIGS. 5a-5c.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
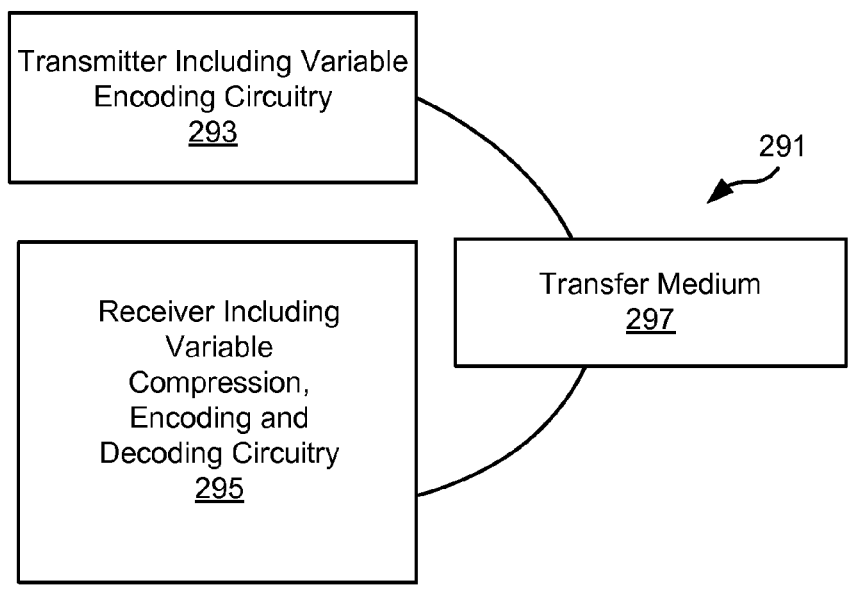
FIG. 2 depicts a data transmission system including variable compression, encoding and decoding circuitry in accordance with one or more embodiments of the present invention.

Turning to FIG. 2, a data transmission system 291 including a receiver 295 having variable size encoding/decoding circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295.

Data transmission system 291 is accessed based upon instructions received from a host controller 290. Host controller 290 includes variable size write circuitry operable to provide data sets of one or more lengths along with a write command where the write data set(s) are to be transmitted by transmitter 293. Transmitter 293 applies variable rate encoding to the received write data, and transfers a resulting encoded data set via transfer medium 297 to receiver 295. The variable encoding applied by transmitter 293 may be implemented similar to that discussed below in relation to FIG. 3a. Receiver 295 processes a received input to yield the originally transmitted data. As part of processing the received information, receiver 295 utilizes variable decoding circuitry to process the received data. The variable decoding circuitry may be implemented similar to that discussed below in relation to FIG. 4. The data encoding and decoding may be done using an approach similar to that discussed below in relation to FIGS. 5a-5c.

Figure 3A:
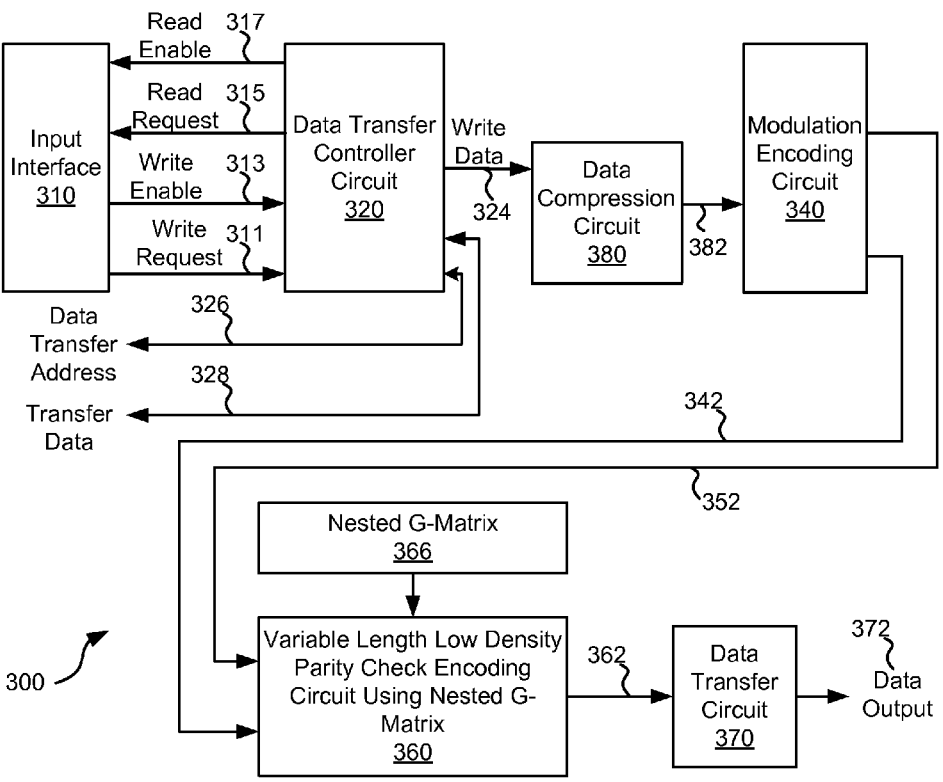
FIG. 3a shows a data encoding circuit operable to apply variable compression encoding along with variable length encoding in accordance with some embodiments of the present invention.

FIG. 3a shows a data encoding circuit 300 operable to apply variable length encoding in accordance with some embodiments of the present invention. Data encoding circuit 300 includes an input interface 310 that is operable to receive and provide control commands and information to/from a host controller (not shown). The control commands and information include, but are not limited to, a read enable 317, a write enable 313, a read request 315, a write request 311, a data transfer address 326 and transfer data 328. When read request 315 is asserted indicating an imminent data read, a read address is provided via data transfer address 326, a read data is provided via transfer data 328, and read enable 317 frames the read data. The read request is provided from a data transfer controller circuit 320 that causes the requested data to be accessed, decoded and provided as read data via transfer data 328. The processing of the read data is done using the circuit described below in relation to FIG. 4.

When write request 311 is asserted indicating an imminent data write, a write address is provided via data transfer address 326, a write data is provided via transfer data 328, and write enable 313 frames the write data. Data transfer controller circuit 320 monitors input data received as transfer data 328 as framed by assertion of write enable 313, and provides the framed write data as write data 324 to a data compression circuit 380 that applies a compression algorithm to yield a compressed data 382. Of note, the length of compressed data 382 is variable with the variance corresponding to the amount of compression to which the received data set was susceptible.

Compressed data 382 is provided to a modulation encoding circuit 340 that performs modulation encoding on the received input to yield a modulated output 352. Of note, the length of modulated output 352 is variable with the variance corresponding to the length of the received compressed output 382. In addition, modulation encoding circuit 340 provides a write length 342 that indicates the length of modulated output 352. In some embodiments of the present invention, modulation encoding circuit 340 may be, but is not limited to, a run length limited encoder circuit as are known in the art. Such a run length limited encoder circuit is operable to apply run length limited encoding that allows for a maximum number of consecutive bits or symbols to repeat. Based upon the disclosure provided herein, one of ordinary skill in the art will recognize a variety of encoding algorithms that may apply encryption, modulation and/or error correction encoding that may be applied in place of or in addition to that applied by modulation encoding circuit 340.

Modulated output 352 and write length 342 are provided to a variable length low density parity check encoding circuit 360. Variable length low density parity check encoding circuit 360 selects a G-matrix included in a nested G-matrix 366.

Each of the G-matrices in nested G-matrix 366 generates a different number of parity bits per unit number of user bits, and the particular one of the G-matrices is selected based upon a difference in write length 342, the number of parity bits generated by the particular G-matrix, and the fixed length of a codeword 362 provided by variable length low density parity check encoding circuit 360. As an example that assumes four G-matrices (i.e., G-matrix A, G-matrix B, G-matrix C and G-matrix D) included in nested G-matrix 366 each providing a respective number of parity bits of a corresponding size (i.e., size A, size B, size C and size D, respectively), and the size of codeword 362 is referred to as "fixed size", then variable length low density parity check encoding circuit 360 selects one of the G-matrices included in nested G-matrix 366 in accordance with the following pseudocode assuming the difference between fixed size and write length 342 is greater than size A, size A is less than size B, size B is less than size C, and size C is less than size D:

```
If ([Fixed Size – Write Length] > size D){
    Select the G-Matrix from Nested G-Matrix that Yields size D;
}
Else if ([Fixed Size – Write Length] > size C){
    Select the G-Matrix from Nested G-Matrix that Yields size C;
}
Else if ([Fixed Size – Write Length] > size B){
    Select the G-Matrix from Nested G-Matrix that Yields size B;
}
Else {
    Select the G-Matrix from Nested G-Matrix that Yields size A
}
```

It should be noted that while the embodiment is described as relying on four different G-matrices in variable length low density parity check encoding circuit 360, any number of G-matrices may be nested into nested G-matrix 366. The nested matrices may be designed using the principles set forth in Xiao, Lei et al., "Nested Codes with Multiple Iterations", 2006 40$^{th}$ Annual Conference on Information Sciences and Systems, Print ISBN 1-4244-0349-9, Jan. 22, 2007. The entirety of the aforementioned reference is incorporated herein by reference for all purposes.

Encoding by variable length low density parity check encoding circuit 360 yields encoded output 362 to a data transfer circuit 370. Data transfer circuit 370 provides a data output 372 to a recipient (not shown). Data transfer circuit 370 may be any circuit known in the art that is capable of transferring a codeword. As one example, data transfer circuit 370 may include a read/write head assembly operable to store information to a storage medium. As another example, data transfer circuit 370 may include a transmitter operable to wirelessly transfer data via a communication medium to a receiver. Based upon the disclosure provided herein, one of ordinary skill in the art will recognize a variety of data transfer circuits that may be used in relation to different embodiments of the present invention.

Figure 3B:
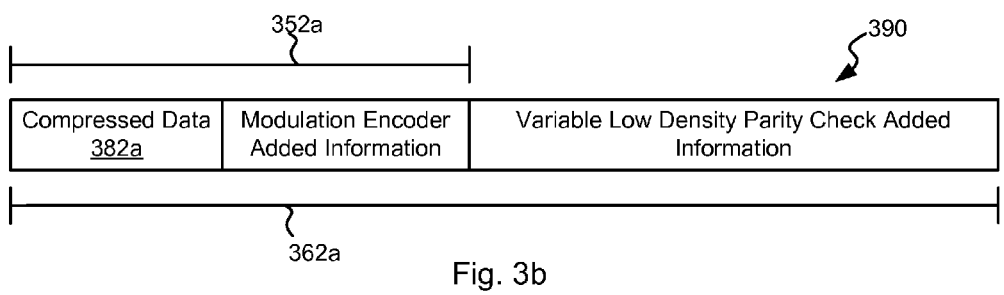

FIG. 3b shows an example 390 of a variably encoded codeword 362a that may be generated using the data encoding circuit of FIG. 3a. In particular, variably encoded codeword 362a includes a combination of modulated output 352a and the variable length low density parity check added information. While modulated output 352a and the variable length low density parity check added information are shown as completely distinct, they may be intermixed and/or include one or more bits of modulated output 352a that are changed as part of the low density parity check encoding process. As shown, modulated output 352a includes compressed data 382a and the modulation encoder added information. Of note, the variable length low density parity check added information is derived from a selected G-matrix that provides parity data of a size that effectively uses the area remaining in codeword 362a after modulated output 352a. Further, it should be noted that while compressed data 382a and modulated encoder added information are shown as completely distinct, they may be intermixed and/or include one or more bits of compressed data 382a that are changed as part of the first level encoding.

Figure 3C:
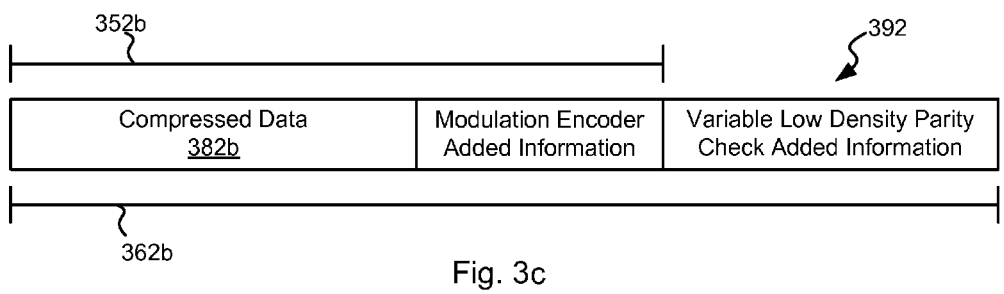
Figure 5A:
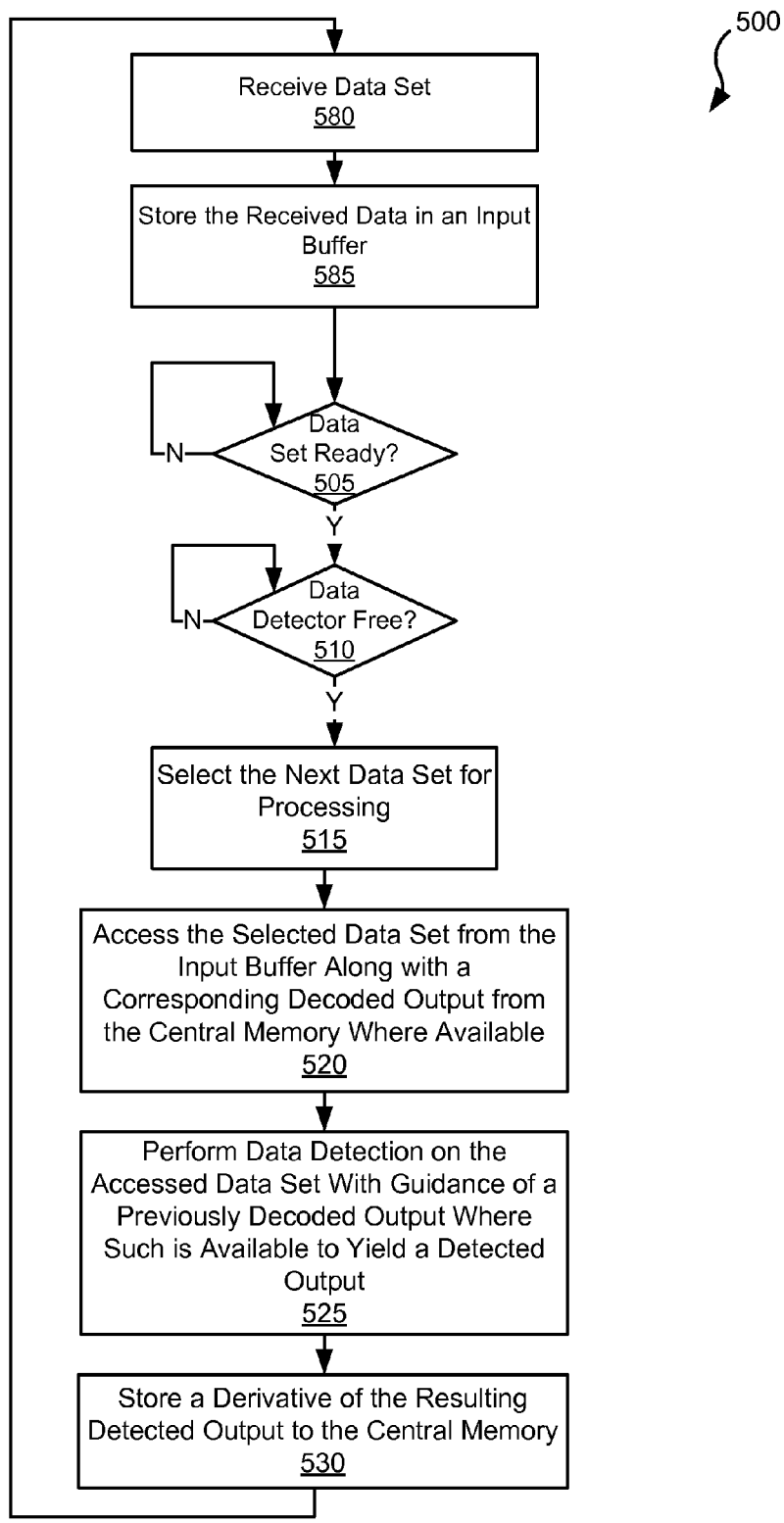
FIGS. 5a-5c are flow diagrams showing a method for data processing utilizing variable length encoding/decoding and compression/decompression in accordance with some embodiments of the present invention.

FIG. 3c shows another example 392 of a variably encoded codeword 362b that may be generated using the data encoding circuit of FIG. 5a. In particular, variably encoded codeword 362b includes a combination of modulated output 352b and the variable length low density parity check added information. While modulated output 352b and the variable length low density parity check added information are shown as completely distinct, they may be intermixed and/or include one or more bits of modulated output 352b that are changed as part of the low density parity check encoding process. As shown, modulated output 352b includes compressed data 382b and the modulation encoder added information. Of note, the variable length low density parity check added information is derived from a selected G-matrix that provides parity data of a size that effectively uses the area remaining in codeword 362b after modulated output 352b. Further, it should be noted that while compressed data 382b and modulated encoder added information are shown as completely distinct, they may be intermixed and/or include one or more bits of compressed data 382b that are changed as part of the first level encoding.

Figure 4:
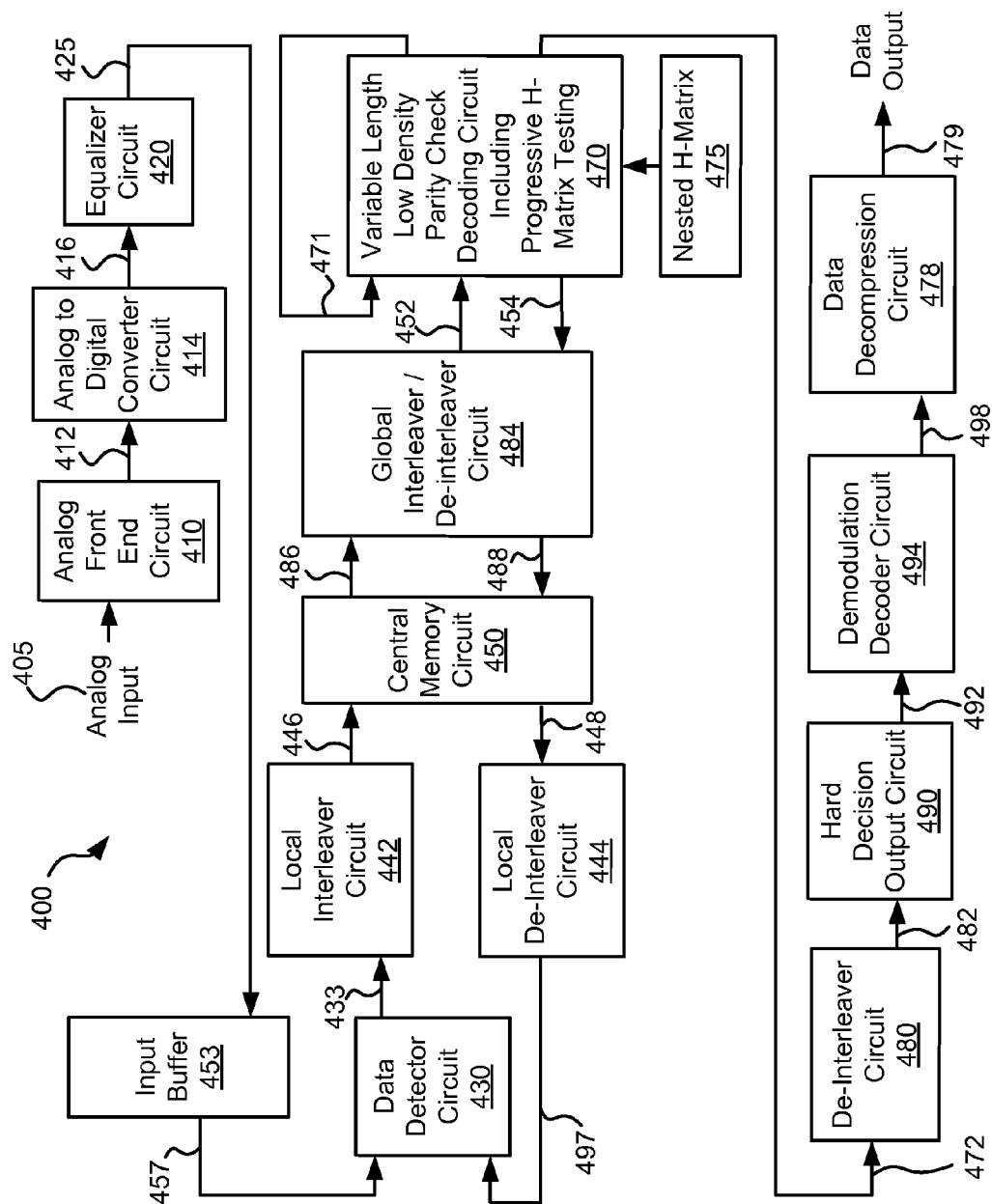
FIG. 4 shows a data decoding circuit operable to apply variable length decoding and decompression in accordance with some embodiments of the present invention.

Turning to FIG. 4, a data decoding circuit 400 operable to apply variable length decoding and decompression is shown in accordance with some embodiments of the present invention. Data decoding circuit 400 includes an analog front end circuit 410 that receives an analog signal 405. Analog front end circuit 410 processes analog signal 405 and provides a processed analog signal 412 to an analog to digital converter circuit 414. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. In some cases, analog signal 405 is derived from a read/write head assembly (not shown) that is disposed in relation to a storage medium (not shown). In other cases, analog signal 405 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 405 may be derived.

Analog to digital converter circuit 414 converts processed analog signal 412 into a corresponding series of digital samples 416. Analog to digital converter circuit 414 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 416 are provided to an equalizer circuit 420. Equalizer circuit 420 applies an equalization algorithm to digital samples 416 to yield an equalized output 425. In some embodiments of the present invention, equalizer circuit 420 is a digital finite impulse response filter circuit as are known in the art. It may be possible that equalized output 425 may be received directly from a storage device in, for example, a solid state storage system. In such cases, analog front end circuit 410, analog to digital converter circuit 414 and equalizer circuit 420 may be eliminated where the data is received as a digital data input. Equalized output 425 corresponds to codeword 362 of FIG. 3a.

Equalized output 425 is stored to an input buffer 453 that includes sufficient memory to maintain one or more codewords until processing of that codeword is completed through a data detector circuit 430 and a data decoding circuit 470 including, where warranted, multiple global iterations (passes through both data detector circuit 430 and data decoding circuit 470) and/or local iterations (passes through data decoding circuit 470 during a given global iteration). An output 457 is provided to data detector circuit 430.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword or data set. In some embodiments of the present invention, data detector circuit 430 is a Viterbi algorithm data detector circuit as are known in the art. In other embodiments of the present invention, data detector circuit 430 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 430 provides a detector output 433. Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Interleaver circuit 442 may be any circuit known in the art that is capable of shuffling data sets to yield a re-arranged data set. Interleaved codeword 446 is stored to central memory circuit 450.

Once data decoding circuit 470 is available, a previously stored interleaved codeword 446 is accessed from central memory circuit 450 as a stored codeword 486 and globally interleaved by a global interleaver/de-interleaver circuit 484. Global interleaver/De-interleaver circuit 484 may be any circuit known in the art that is capable of globally rearranging codewords. Global interleaver/De-interleaver circuit 484 provides a decoder input 452 into data decoding circuit 470. The first application of the decoding algorithm by data decoding circuit 470 selects an initial H-matrix from a nested H-matrix 475. The H-matrices included in nested H-matrix correspond to the G-matrices in nested G-matrix 366 of FIG. 3a. Data decoding circuit 470 applies a data decode algorithm to decoder input 452 to yield a decoded output 471. The data decode algorithm is a low density parity check algorithm corresponding to the selected H-matrix designed to reverse the encoding applied by low density parity check encoding circuit 360 of FIG. 3a where the selected H-matrix within nested H-matrix 475 corresponds to the G-matrix within nested G-matrix 366 that was selected for the encoding of the codeword being processed.

An example of a nested H-matrix 475 is shown in FIGS. 6a-6d where it is shown as having four H-matrices 600, 610, 620, 630. FIG. 6a shows H-matrix 600 that includes a number of parity bits 602 per a given number of user bits 601. FIG. 6b shows H-matrix 610 that includes a number of parity bits 612 per a given number of user bits 611. FIG. 6c shows H-matrix 630 that includes a number of parity bits 622 per a given number of user bits 621. FIG. 6d shows H-matrix 630 that includes a number of parity bits 632 per a given number of user bits 631. The four H-matrices are combined in nested H-matrix 475 such that a common decoding circuit (data decoding circuit 470) can operate across all of the H-matrices. The nested matrices may be designed using the principles set forth in Xiao, Lei et al., "Nested Codes with Multiple Iterations", 2006 $40^{th}$ Annual Conference on Information Sciences and Systems, Print ISBN 1-4244-0349-9, Jan. 22, 2007. The entirety of the aforementioned reference was previously incorporated herein by reference for all purposes. It should be noted that while the embodiment is described as relying on four different H-matrices, any number of H-matrices may be nested into nested H-matrix 475 such that nested H-matrix 475 corresponds to nested G-matrix of FIG. 3a.

Data decoding circuit 470 operates to enable and disable different parity check equations depending upon which H-matrix from nested H-matrix 475 is being used to control application of the data decoding algorithm. An example of this is shown in FIG. 7a where all check nodes (represented as square blocks) are active due to the selection of a particular one of the H-matrices within nested H-matrix 475. FIG. 7b shows another example where one of the check nodes is disabled (represented as a square block with an X through it) and the other check nodes are active due to the selection of another particular one of the H-matrices within nested H-matrix 475. FIG. 7c shows another example where two of the check nodes are disabled and the other check nodes are active due to the selection of yet another particular one of the H-matrices within nested H-matrix 475. FIG. 7b shows another example where three of the check nodes are disabled and the other check nodes are active due to the selection of yet a further particular one of the H-matrices within nested H-matrix 475.

Retuning to FIG. 4, in cases where the data decode algorithm failed to converge (i.e., failed to yield the originally written data set) and another local iteration (i.e., another pass through data decoder circuit 470) is desired, the next H-matrix within nested H-matrix is selected and data decoding circuit 470 applies the data decode algorithm corresponding to the newly selected H-matrix to decoder input 452 guided by decoded output 471. This continues until either a maximum number of local iterations is exceeded or decoded output 471 converges. Such convergence of data output 471 is found where either a pass through data decoding circuit 470 using a first H-matrix converges and a subsequent pass through data decoding circuit 470 using a second H-matrix fails to converge, or a pass through data decoding circuit 470 using a first H-matrix fails to converge and a subsequent pass through data decoding circuit 470 using a second H-matrix converges.

Where decoded output 471 fails to converge and a number of local iterations through data decoder circuit 470 exceeds a threshold, the resulting decoded output is provided as a decoded output 454 back to central memory circuit 450 where it is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425.

Alternatively, where the decoded output converges (i.e., yields the originally written data set and either a preceding or succeeding H-matrix failed to yield the originally written data set), the resulting decoded output is provided as an output codeword 472 to a de-interleaver circuit 480. De-interleaver circuit 480 rearranges the data to reverse both the global and local interleaving applied to the data to yield a de-interleaved output 482. De-interleaved output 482 is provided to a hard decision output circuit 490. Hard decision output circuit 490 is operable to re-order data sets that may complete out of order back into their original order. The originally ordered data sets are then provided as a modulated output 492. Modulated output 492 corresponds to modulated output 352 of FIG. 3a.

Modulated output 492 is provided to demodulation decoder circuit 494 that reverses the encoding applied by modulation encoding circuit 340 of FIG. 3a to yield a demodulated output 498. Demodulated output 498 is provided to a data decompression circuit 478 that reverses the compression originally applied by data compression circuit 380 of FIG. 3a. The result of data decompression circuit 480 is provided as a data output 479 that corresponds to originally written data.

Figure 5B:
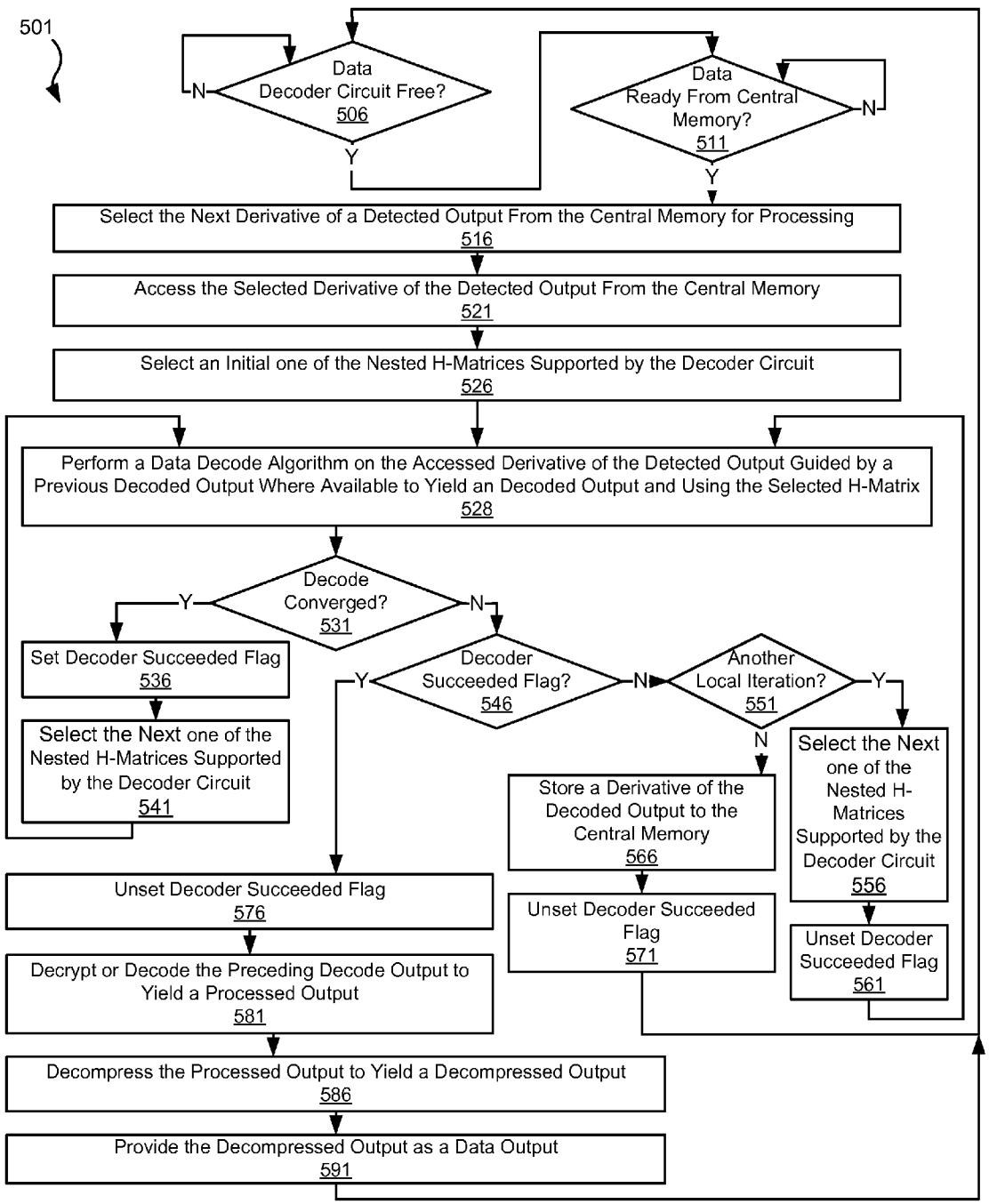
Figure 5C:
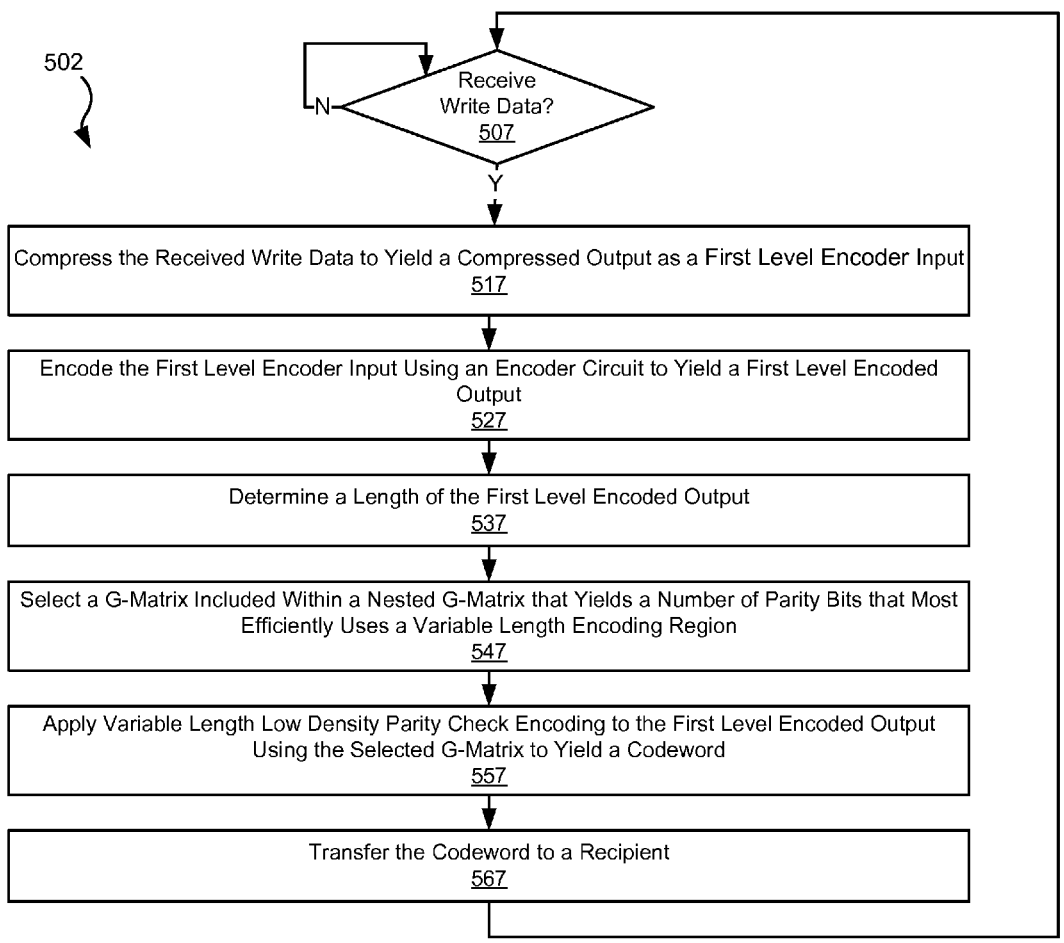

Turning to FIG. 5a-5c, flow diagrams 500, 501, 502 show a method for data processing utilizing variable length encoding/decoding and compression/decompression in accordance with some embodiments of the present invention. Following flow diagram 500 of FIG. 5a, a data set is received (block 580) and stored in an input buffer (block 585). This received data set may be derived from, for example, a storage medium, or a communication medium via a transmitter. Based upon the disclosure provided herein, one of ordinary skill in the art will recognize a variety of sources of the received data. It is determined whether a data set is ready in the input buffer (block 505). A data set may be considered ready when an entire codeword is available in the input buffer, or when a sufficient part of a codeword is in the input buffer such that a data detection algorithm can run continuously to the end of the codeword as it becomes available in the input buffer. Where a data set is ready (block 505), it is determined whether a data detector circuit is available to process the data set (block 510). The data detector circuit may be, for example, a Viterbi algorithm data detector circuit or a maximum a posteriori data detector circuit as are known in the art Where the data detector circuit is available for processing (block 510), the next data set in the input buffer is selected for processing (block 515). The selection of the next data set may be done in accordance with any scheduling or priority scheme known in the art. The selected data set is accessed from the input buffer (block 520). Where this is the second or later global iteration for the selected data set, a corresponding decoded output is also accessed from the central memory. A data detection algorithm is then applied to the accessed data set to yield a detected output (block 525). Where it is a second or later global iteration for the accessed data set, the corresponding decoded output is used to guide application of the data detection algorithm. The data detection algorithm may be, but is not limited to, a maximum a posteriori data detection algorithm or a Viterbi data detection algorithm. Based upon the disclosure provided herein, one of ordinary skill in the art will recognize a variety of data detection algorithms that may be used in relation to different embodiments of the present invention. A derivative of the detected output is stored to the central memory (block 530). The derivative of the detected output may be, for example, an interleaved or shuffled version of the detected output.

Following flow diagram 501 of FIG. 5b, it is determined in parallel to the previously described data detection process of FIG. 5a whether a data decoder circuit is available to process a new data set (block 506). Where a data decoder circuit is available to process (block 506), it is determined whether a derivative of a detected output is available for processing in the central memory (block 511). Where such a data set is ready (block 511), the next derivative of a detected output is selected for processing (block 516). The selection of the next derivative of the detected output may be done in accordance with any scheduling or priority scheme known in the art. The selected derivative of the detected output is accessed from the central memory (block 521). An initial one of the H-matrices included in a nested H-matrix supported by a data decoder circuit is selected (block 526). The selected H-matrix may be any one of the H-matrices included in nested H-matrix where it is the first pass through the data decoder circuit for the currently processing data set. Alternatively, the selected H-matrix may be one of the H-matrices within the nested H-matrix that has not previously been selected in relation to the currently processing data set.

A data decode algorithm is applied to the accessed detected output using the selected H-matrix to yield a decoded output (block 528). Where a previous local iteration has been performed on the received codeword, the results of the previous local iteration (i.e., a previous decoded output) are used to guide application of the decode algorithm. Where a previous local iteration has not been performed on the received codeword, the results of the previous local iteration (i.e., a previous decoded output) are not available and therefore are not used to guide application of the decode algorithm.

It is then determined whether the decoded output converged (i.e., resulted in the originally written data) (block 531). Where the decoded output converged (i.e., all of the parity check equations are resolved)(block 531), a decoder succeeded flag is set (block 536). This decoder succeeded flag is set to indicate a successful decode. In this case shown in FIG. 5b, a successful convergence is only indicated where a convergence is found using one H-matrix from the nested H-matrix followed by a failure of convergence using another H-matrix from the nested H-matrix. Setting the decoder succeeded flag allows for tracking the successive convergence/non-convergence pattern. The next H-matrix from the nested H-matrix is selected (block 541), and the decoding process of block 528 is repeated for the currently processing codeword using the next H-matrix.

Alternatively, where the decoded output did not converge (block 531), it is determined whether the decoder succeeded flag was previously set (block 546). Where the decoder succeeded flag was previously set (block 546), the previous data decode converged using the previously selected H-matrix followed by a failure to converge using the next selected H-matrix, thus qualifying as successful convergence. Where such a successful convergence is found, the decoder succeeded flag is unset (block 576), and the result of the preceding decode process (i.e., the decode process that converged) is decrypted or decoded to yield a processed output (block 581). This decode may be, for example, a modulation decode that reverses a run length limited encoding of the data set. The processed output is then decompressed using a decompression algorithm that reverses any compression applied during the encoding process to yield a decompressed output (block 586). The decompressed output is then provided as a data output to a recipient (block 591).

Alternatively, where the decoder succeeded flag was not previously set (block 546), it is determined whether another local iteration is desired (block 551). In some cases, four local iterations are allowed per each global iteration. Based upon the disclosure provided herein, one of ordinary skill in the art will recognize another number of local iterations that may be used in relation to different embodiments of the present invention. Where another local iteration is desired (block 551), the next H-matrix from the nested H-matrix is selected (block 556) and the decoder succeeded flag is unset (block 561). The decoding process of block 528 is repeated for the currently processing codeword using the next H-matrix.

Alternatively, where another local iteration is not desired (block 551), a derivative of the decoded output is stored to the central memory (block 566). The derivative of the decoded output being stored to the central memory triggers the data set ready query of block 505 to begin the data detection process. In addition, the decoder succeeded flag is unset (block 571).

Following flow diagram 502 of FIG. 5c, data encoding and compression is discussed that yields codewords that may be processed using the approaches discussed above in relation to FIGS. 5a-5b. It is determined whether data has been received for transfer to an encoding circuit (block 507). The received write data is then compressed to yield a compressed output that is provided as an input to a first level encoder (block 517). The first level encoder input is encoded using an encoder circuit to yield a first level encoded output (block 527). In some embodiments of the present invention, the encoding that yields the first level encoded output is a run length limited encoding as is known in the art. Based upon the disclosure provided herein, one of ordinary skill in the art will recognize a variety of encoding algorithms that may be used in relation to various embodiments of the present invention.

A length of the first level encoder output is determined (block 537). Based upon the determined length, a G-matrix within a nested G-matrix is selected (block 547). The particular G-matrix is selected from a number of G-matrices within the nested G-matrix based upon which G-matrix will make the most efficient use of a fixed length codeword. For example, one G-matrix may generate one parity bit per a number of user data, another G-matrix may generate two parity bits per the number of user data, and yet another G-matrix may generate three parity bits per the number of user data. Where the first level output is relatively short, a G-matrix generating a larger number of parity bits be the number of user data is selected. In contrast, where the first level output is relatively long, a G-matrix generating a smaller number of parity bits be the number of user data is selected. As an example, where three G-matrices are included in the nested G-matrix (a G-Matrix A that generates a variable low density parity check added information of size A, a G-Matrix B that generates a variable low density parity check added information of size B, and a G-Matrix C that generates a variable low density parity check added information of size C), the first level encoder output is of size D, and the defined size of the codeword is size E, then the selected encoder is selected in accordance with the following pseudocode that assumes size E less size D is greater than size A, and size B is greater than size A, and size C is greater than size B:

```
If ([size E – size D] > size C){
    Select G-Matrix C;
}
Else if ([size E – size D] > size B){
    Select G-Matrix B;
}
Else {
    Select G-Matrix A;
}
```

It should be noted that while the embodiment is described as relying on four encoders (G-Matrix C, G-Matrix B, and G-Matrix A), any number of G-matrices include in the nested G-Matrix may be used and selected between in accordance with different embodiments of the present invention.

A variable length low density parity check encoding is applied to the first level encoded output using the selected G-matrix to yield a codeword (block 557). The codeword is of a defined length. In some cases, the defined length of the codeword is greater than the number of bits in the combination of the first level encoded output and variable low density parity check added information. In such a case, some padding bits are added. The resulting codeword is then transferred (block 567).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for prioritizing data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a variable length data decoder circuit operable to:
     receive an encoded input;
     select a first H-Matrix to yield a first selected H-Matrix;
     apply a decode algorithm to the encoded input based upon the first selected H-Matrix to yield a first decoded output;
     select a second H-matrix to yield a second selected H-Matrix;
     apply the decode algorithm to the encoded input based upon the second selected H-Matrix to yield a second decoded output; and
     provide the first decoded output as a data output where the first decoded output converged and the second decoded output failed to converge.

2. The data processing system of claim 1, wherein selection of the first H-Matrix precedes selection of the second H-Matrix.

3. The data processing system of claim 1, wherein selection of the first H-Matrix comes after selection of the second H-Matrix.

4. The data processing system of claim 1, wherein the data processing system further comprises:
   a data detector circuit operable to apply a data detection algorithm to a data input to yield a detected output, wherein the encoded input is derived from the detected output.

5. The data processing system of claim 1, wherein the variable length decoder circuit is a variable length low density parity check decoder circuit.

6. The data processing system of claim 1, wherein the first H-Matrix and the second H-Matrix are incorporated in a nested H-Matrix.

7. The data processing system of claim 6, wherein the first H-Matrix is operable to decode a codeword including a first number of parity bits per number of data bits, and wherein the second H-Matrix is operable to decode a codeword including a second number of parity bits per number of data bits.

8. The data processing system of claim 7, wherein variable length data decoder circuit is operable to disable one or more parity check equations based upon which of the first H-Matrix and the second H-Matrix is selected.

9. The data processing system of claim 1, wherein the data processing system further comprises:
   a data compression circuit operable to compress a received input to yield a compressed output;
   a first encoder circuit operable to modify the compressed output to yield a modified output; and
   a second encoder circuit operable to:
     determine a length of the modified output;
     based at least in part on the length of the modified output, select a G-Matrix from at least a first G-Matrix and a second G-Matrix to yield a selected G-Matrix; and
     encode the modified output based upon the selected G-Matrix to yield a codeword, wherein selection of the first G-Matrix causes the second encoder to yield a first number of parity bits for the modified output, and wherein selection of the second G-Matrix causes the second encoder to yield a second number of parity bits for the modified output.

10. The data processing system of claim 9, wherein the first G-Matrix yields a codeword compatible with the first H-Matrix, and wherein the second G-Matrix yields a codeword compatible with the second H-Matrix.

11. The data processing system of claim 9, wherein a defined length of the codeword less the first number of parity bits and the length of the modified output is a first size, wherein the defined length of the codeword less the second number of parity bits and the length of the modified output is a second size, and wherein the selected G-Matrix is the first G-Matrix when the first size is less than the second size.

12. The data processing system of claim 9, wherein the second encoder is a variable length low density parity encoder circuit.

13. The data processing system of claim 9, wherein the first encoder is a run length limited encoder circuit.

14. The data processing system of claim 1, wherein the system is implemented as an integrated circuit.

15. The data processing system of claim 1, wherein the data processing system is incorporated in a device selected from a group consisting of: a storage device, and a data transmission device.

16. A method for data processing, the method comprising:
   receiving an encoded input;
   selecting a first H-Matrix to yield a first selected H-Matrix;
   applying a decode algorithm to the encoded input based upon the first selected H-Matrix to yield a first decoded output;
   selecting a second H-matrix to yield a second selected H-Matrix;
   applying the decode algorithm to the encoded input based upon the second selected H-Matrix to yield a second decoded output; and
   providing the first decoded output as a data output where the first decoded output converged and the second decoded output failed to converge.

17. The method of claim 16, wherein selecting the second H-Matrix and applying the decode algorithm to the encoded input based upon the second selected H-Matrix precedes selecting the first H-Matrix and applying the decode algorithm to the encoded input based upon the first selected H-Matrix.

18. The method of claim 16,
   compressing a received input to yield a compressed output;
   applying a first level encoding to the compressed output to yield a modified output;
   selecting a G-Matrix from at least a first G-Matrix and a second G-Matrix to yield a selected G-Matrix;
   determining a length of the modified output;
   selecting a G-Matrix from at least a first G-Matrix and a second G-Matrix to yield a selected G-Matrix, wherein the first G-Matrix yields a codeword compatible with the first H-Matrix, and wherein the second G-Matrix yields a codeword compatible with the second H-Matrix; and
   applying a second level encoding to the modified output based on the selected G-Matrix to yield a codeword, wherein selection of the first G-Matrix as the selected G-Matrix causes the second level encoding to yield a first number of parity bits for the modified output, and wherein selection of the second G-Matrix as the selected G-Matrix causes the second level encoding to yield a second number of parity bits for the modified output, and wherein the encoded input is derived from the codeword.

19. A storage device, the storage device comprising:
a storage medium;
a head assembly disposed in relation to the storage medium and operable to:
  write information on the storage medium; and
  provide a sensed signal corresponding to the information on the storage medium;
a read channel circuit including:
  a variable length data decoder circuit operable to:
    receive an encoded input;
    select a first H-Matrix to yield a first selected H-Matrix;
    apply a decode algorithm to the encoded input based upon the first selected H-Matrix to yield a first decoded output;
    select a second H-matrix to yield a second selected H-Matrix;
    apply the decode algorithm to the encoded input based upon the second selected H-Matrix to yield a second decoded output; and
    provide the first decoded output as a data output where the first decoded output converged and the second decoded output failed to converge.

20. The storage device of claim 19, wherein the read channel circuit further comprises:
  a data compression circuit operable to compress a received input to yield a compressed output;
  a first encoder circuit operable to modify the compressed output to yield a modified output;
  a second encoder circuit operable to:
    determine a length of the modified output;
    select a G-Matrix from at least a first G-Matrix and a second G-Matrix to yield a selected G-Matrix, wherein the first G-Matrix yields a codeword compatible with the first H-Matrix, and wherein the second G-Matrix yields a codeword compatible with the second H-Matrix; and
    encode the modified output based upon the selected G-Matrix to yield a codeword, wherein selection of the first G-Matrix causes the second encoder to yield a first number of parity bits for the modified output, and wherein selection of the second G-Matrix causes the second encoder to yield a second number of parity bits for the modified output.

* * * * *